(12) United States Patent
Dutta

(10) Patent No.: US 10,483,297 B2
(45) Date of Patent: Nov. 19, 2019

(54) ENERGY HARVESTING DEVICES AND METHOD OF FABRICATION THEREOF

(71) Applicant: Achyut Kumar Dutta, Sunnyvale, CA (US)

(72) Inventor: Achyut Kumar Dutta, Sunnyvale, CA (US)

(73) Assignee: Baupil Photonoics, Inc., Santa Clara, CA (US)

( * ) Notice: Subject to any disclaimer, the term of this patent is extended or adjusted under 35 U.S.C. 154(b) by 0 days.

(21) Appl. No.: 15/468,603

(22) Filed: Mar. 24, 2017

(65) Prior Publication Data
US 2017/0200751 A1  Jul. 13, 2017

Related U.S. Application Data

(62) Division of application No. 13/831,840, filed on Mar. 15, 2013, now Pat. No. 9,640,698.

(51) Int. Cl.
| | |
|---|---|
| *H01L 27/142* | (2014.01) |
| *H01L 51/44* | (2006.01) |
| *H01L 51/42* | (2006.01) |
| *H01L 27/30* | (2006.01) |
| *H01L 31/076* | (2012.01) |
| *H01L 31/0224* | (2006.01) |
| *H01L 31/0352* | (2006.01) |
| *H01L 31/0687* | (2012.01) |
| *H01L 31/18* | (2006.01) |

(52) U.S. Cl.
CPC .......... *H01L 27/142* (2013.01); *H01L 27/302* (2013.01); *H01L 31/022441* (2013.01); *H01L 31/03529* (2013.01); *H01L 31/0687* (2013.01); *H01L 31/076* (2013.01); *H01L 31/1828* (2013.01); *H01L 51/4213* (2013.01); *H01L 51/447* (2013.01); *H01L 51/448* (2013.01); *Y02E 10/543* (2013.01); *Y02E 10/544* (2013.01)

(58) Field of Classification Search
CPC ....... H01L 31/022441; H01L 31/03529; H01L 31/0687; H01L 31/076; H01L 31/1828
USPC ....................................................... 136/260
See application file for complete search history.

(56) References Cited

U.S. PATENT DOCUMENTS

| | | | | |
|---|---|---|---|---|
| 7,982,130 B2* | 7/2011 | Forrest | ................. | B82Y 10/00 136/263 |
| 8,632,663 B2* | 1/2014 | Yoshida | ................. | C01B 3/04 136/252 |
| 2005/0155641 A1* | 7/2005 | Fafard | ................. | B82Y 10/00 136/249 |
| 2006/0283498 A1* | 12/2006 | Gronet | ............. | H01L 31/02008 136/256 |
| 2008/0072971 A1* | 3/2008 | Honeychurch | ........... | E03B 1/04 137/468 |

(Continued)

OTHER PUBLICATIONS

Minnaert et al., Guidelines for the Bandgap Combinations and Absorption Windows for Organic Tandem and Triple-Junction Solar Cells, Materials Issue/vol. 5, pp. 1933-1953 (Year: 2012).*

*Primary Examiner* — Jayne L Mershon

(57) ABSTRACT

An apparatus and method pertaining to a perpetual energy harvester. The harvester absorbs ambient infrared radiation and provides continual power regardless of the environment. The device seeks to harvest the largely overlooked blackbody radiation through use of a semiconductor thermal harvester.

19 Claims, 6 Drawing Sheets

(56) References Cited

U.S. PATENT DOCUMENTS

| | | | |
|---|---|---|---|
| 2010/0282314 A1* | 11/2010 | Coakley | H01L 31/0236 136/258 |
| 2010/0307553 A1* | 12/2010 | Defries | B82Y 20/00 136/243 |
| 2011/0114156 A1* | 5/2011 | Coakley | H01L 31/02366 136/249 |
| 2011/0175065 A1* | 7/2011 | de la Vega | H01L 31/1884 257/40 |
| 2012/0111395 A1* | 5/2012 | Kim | H01L 31/03921 136/255 |
| 2012/0186641 A1* | 7/2012 | Sharps | H01L 31/0687 136/255 |
| 2013/0098435 A1* | 4/2013 | Zhao | H01L 31/022466 136/256 |
| 2013/0263923 A1* | 10/2013 | Jones-Albertus | H01L 31/0725 136/262 |
| 2013/0319502 A1* | 12/2013 | Chawla | H01L 31/022466 136/246 |
| 2013/0327384 A1* | 12/2013 | Endo | H01L 21/02395 136/255 |
| 2013/0333751 A1* | 12/2013 | Norman | H01L 21/02381 136/255 |

\* cited by examiner

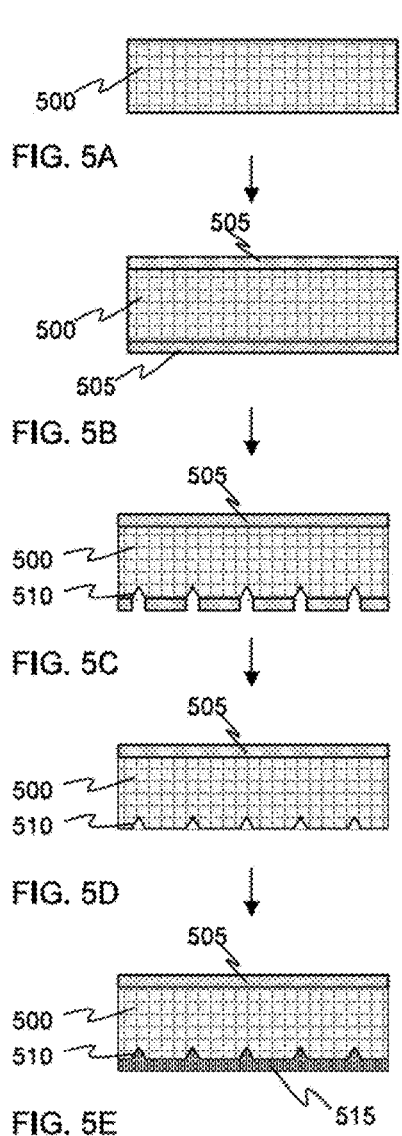
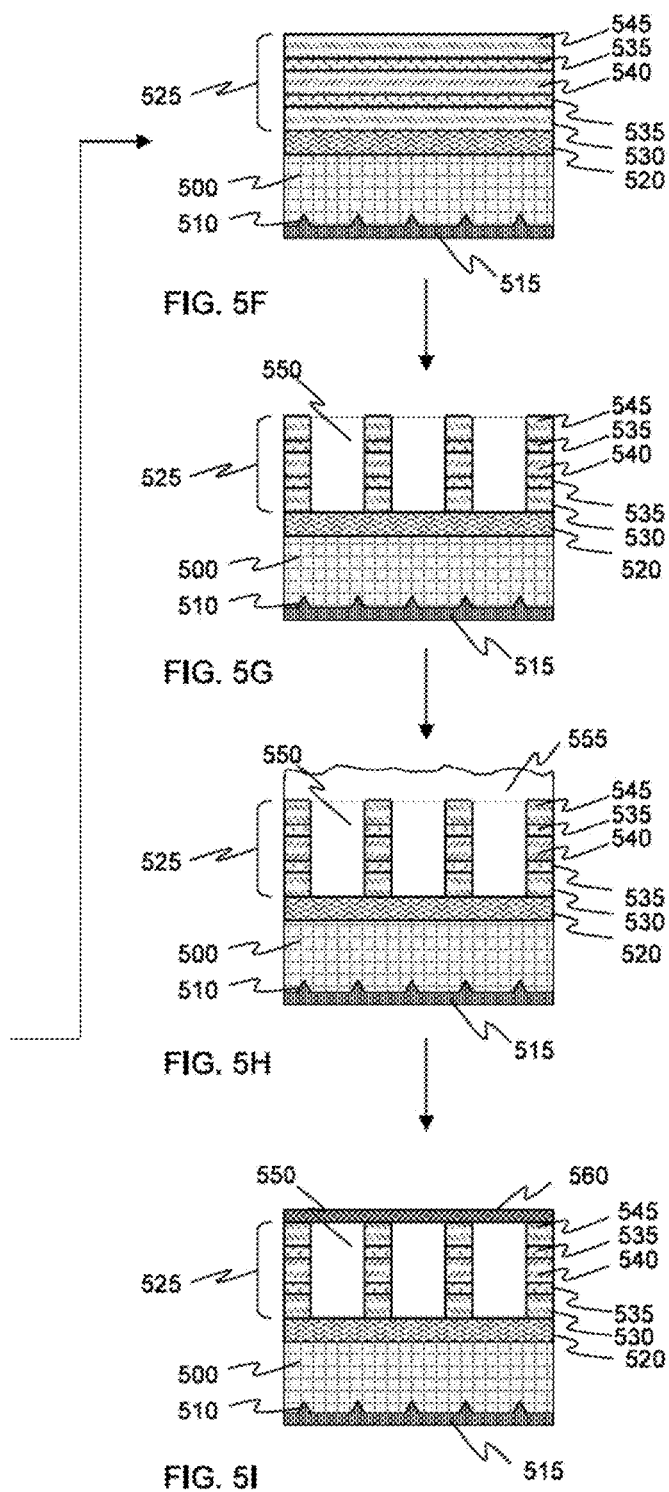

US 10,483,297 B2

ENERGY HARVESTING DEVICES AND METHOD OF FABRICATION THEREOF

PARENT CASE TEXT

This is a divisional of application(s) Ser. No. 13/831,840 filed on Mar. 15, 2013.

STATEMENT REGARDING FEDERALLY SPONSORED RESEARCH AND DEVELOPMENT

This invention was made with United States Government support under W31P4Q10C0034 awarded by US Army Contracting Command and also under W91CRB11C0097 awarded by US Army Contracting Command. As such, the United States Government has certain rights in this invention.

FIELD OF THE INVENTION

This invention pertains to harvesting ambient radiation from the infrared spectrum to generate power. More particularly this invention is related to a semiconductor perpetual thermal harvesting device that will continually harvest and provide continuous power during both day and night in any environment.

BACKGROUND OF INVENTION

Energy harvesting has been around for many years in the form of windmills and watermills. Modern technology has transformed them into wind turbines, hydro-electric plants, and solar panel arrays. These methods of harvesting energy offers two significant advantages over battery powered solutions: virtually inexhaustible resources and little or no adverse environmental effects.

However, the various technologies used in large scale energy harvesting all require a connection to the power grid. Given the trend towards wireless systems, the continuously powered device which never needs to be recharged by connecting to the power grid is the ultimate goal. While ultra-low-power technology is developing, current radiation harvesting devices are very limited. The traditional crystalline silicon, cadmium telluride, and copper indium gallium selenide solar cells only provide power during the daytime. None of the current solutions can provide continuous, around the clock energy harvesting.

BRIEF DESCRIPTION OF THE DRAWINGS

FIG. 5A-I depicts a process for manufacturing a thermal harvester with single or multiple junctions.

DETAILED DESCRIPTION

Figure 1:
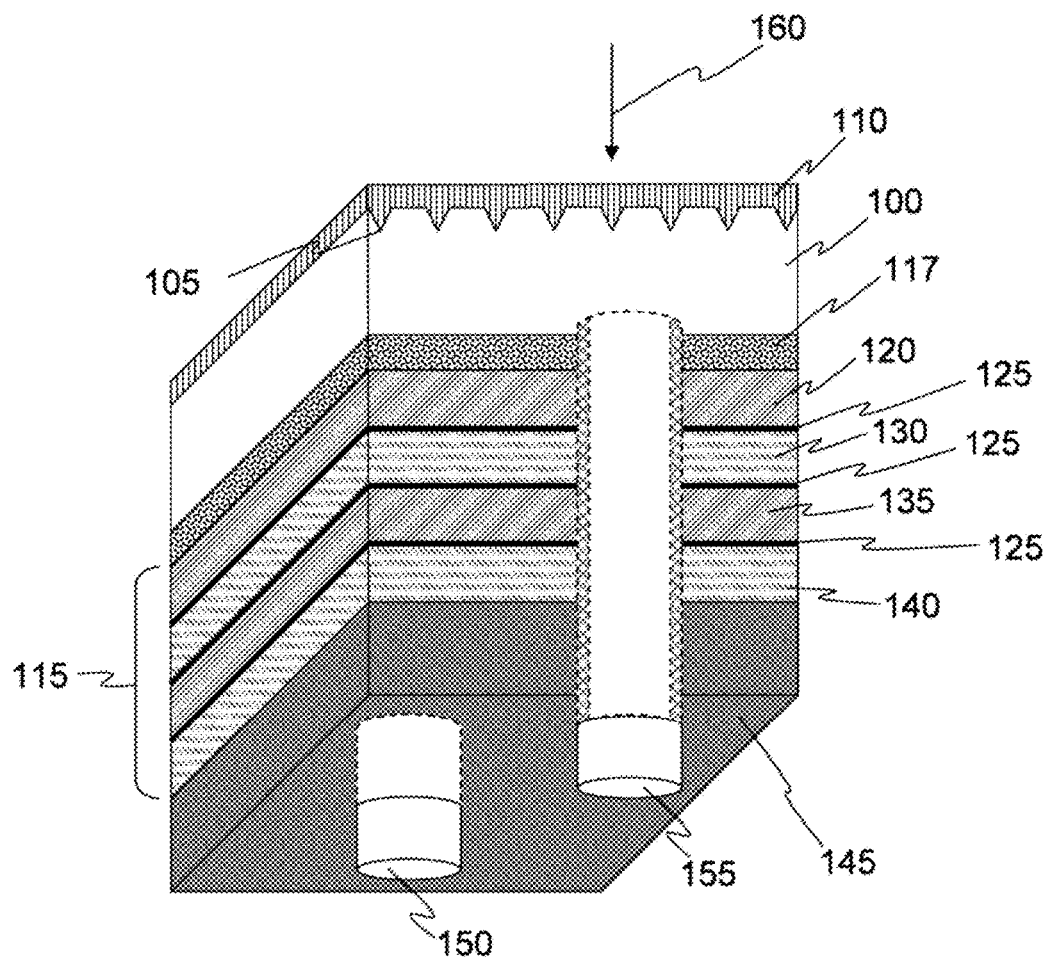
FIG. 1 depicts a thermal harvester cross-section with multiple junctions.

Reference is made in detail to the preferred embodiments of the invention. While the invention is described in conjunction with the preferred embodiments, the invention is not intended to be limited by these preferred embodiments. The contemplated embodiments for carrying out the present invention are described in turn with reference to the accompanying figures.

For the purposes this invention, perpetual is defined to be occurring continuously, independent of time, location, or temperature. Energy harvesting for the purposes of this invention is defined to be absorbing radiation and using it to generate a direct current. The term electrically connected is defined to encompass an electrical current flow, including bidirectional, unidirectional, or any hybrid current flow, such as an uneven current.

A photovoltaic device is defined to be a device that absorbs photons to generate a current. The absorption of the photons provides the electrons with the energy to jump the bandgap between the valance band and the conduction band, leaving a positive charge called a hole behind. Each bandgap has a minimum amount of energy required by the electrons to jump the bandgap and the amount may vary depending on the material. The minimum amount of energy may be translated to a cutoff wavelength using Plank's relation:

$$E = \frac{hc}{\lambda},$$

where h is Plank's constant, E is energy, and c is the speed of light. Photons with wavelengths longer than the cutoff wavelength will not provide the necessary energy required to surmount the material's bandgap and will pass through the material.

Photovoltaic devices typically comprise semiconductors configured in p-n or p-i-n junctions. A p-n junction is formed by joining p-type and n-type semiconductors in close contact. A p-i-n junction is similar to a p-n junction, but includes a very low doped intrinsic layer between the p-type and n-type semiconductors. Due to the electric field generated by the diffusion regions of the p-n or p-i-n junctions the electrons and holes are moved in opposite directions generating a current.

Radiation is defined to be the electromagnetic spectrum, particularly the near ultraviolet, visible, near infrared, short-wave infrared, mid-wave infrared, long-wave infrared and far infrared bands. The near ultraviolet band is comprised of wavelengths from about 300 to 400 nm. The visible light band is comprised of wavelengths from about 400 to 780 nm. The near infrared band is comprised of wavelengths from about 0.78 to 1 μm. The short-wave infrared band is comprised of wavelengths from about 1 to 3 μm. The mid-wave infrared band is comprised of wavelengths from about 3 to 6 μm. The long-wave infrared band is comprised of wavelengths from 6 to 14 μm. The far infrared band is comprised of wavelengths from about 14 to 40 μm.

Conventional energy harvesting devices are limited to daytime use, because of their sole focus on the visible spectrum. Blackbody radiation has been largely overlooked. The blackbody radiation spectrum ranges from near ultraviolet to the infrared spectrum. The available blackbody radiation can be calculated through Planck's blackbody equation, $$W(\lambda) = \frac{c_1}{\lambda^5 (e^{c_2/\lambda T} - 1)},$$

where $c_1=2\pi c^2 h=37418.32$ W $\mu^4 cm^{-2}$ and $c_2=hc/k=14387.86$ $\mu K$. In $c_1$ and $c_2$, c is the speed of light, k is Boltzmann's constant, h is Planck's constant, $\lambda$ is wavelength, and T is temperature in Kelvin. As temperature increases, power (in watts per meters squared) increases at lower wavelengths. Using Stefan-Boltzmann's law, $5.67\times 10^{-8}\times T^4$, the total available blackbody radiation at a given temperature can be calculated. At room temperature, about 300 degrees Kelvin, the total available blackbody radiation is estimated to be 500 W/m$^2$ with a peak between 4 to 10 nm.

Utilizing Planck's blackbody equation, the amount of power available at a given wavelength and temperature can be calculated. This aids in determining what bandgap to select for the p-n or p-i-n junction to set the cutoff wavelength.

A major difficulty to overcome is the fact that intrinsic carriers cause excessive dark current at high temperature. Infrared detectors share the same problem and are normally operated at 77 degrees Kelvin to minimize dark current. In energy harvesting, dark current will subtract from harvested energy. A solution to this problem will be described under FIG. 2.

FIG. 1 illustrates one embodiment of the invention, a cross-section of a semiconductor thermal harvester comprising a single junction. The thermal harvester is a photovoltaic device that absorbs photons with wavelengths in the infrared spectrum. The thermal radiation 160 is comprised of photons with wavelengths in the infrared spectrum comprised of the near infrared, short-wave infrared, mid-wave infrared, long-wave infrared, and far infrared bands.

The structure of the thermal harvester comprises a substrate 100. The substrate 100 may be comprised of group IV semiconductors, group III-V semiconductors, or group II-VI semiconductors. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe. Optionally the buffer may be doped to be either n-type or p-type. Alternatively, the substrate 100 may be comprised of silicon on insulator (SOI), metal, dielectric, insulator, or polymer. The material comprising the substrate 100 may be transparent or partially transparent to all or a portion of the spectrum comprising the thermal radiation 160.

Optionally, one surface of the substrate 100 may be comprised of grooves 105 which serve an antireflective purpose to focus the thermal radiation 160 and direct it through the substrate 100 and subsequent layers. Optionally, a nanoscaled pattern may be used instead of grooves 105 to accomplish the same purpose. Optionally, either in addition or alternatively to the grooves 105 or pattern, an anti-reflective coating 110 may also be attached to the same surface as the pattern to minimize the amount of thermal radiation 160 reflected and to direct the thermal radiation 160 through the substrate 100 and subsequent layers. The anti-reflective coating 110 may be comprised of a single or multiple layers of anti-reflective material and may be planar or non-planar. Optionally, the anti-reflective coating 110 may be comprised of nanocrystals or photonic crystals to control the direction of light propagation. The anti-reflective coating may be comprised of $SiO_2$, $SiN_x$, ZnO, metal oxides, insulators, or semiconductors.

Optionally, a buffer layer 117 may be included on the opposite surface of the substrate 100 from the coating. The buffer layer 117 may be comprised of group IV semiconductors, group III-V semiconductors, or group II-VI semiconductors. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe.

Optionally, the buffer layer 117 may be a similar material system or a dissimilar material system from the substrate 100. A similar material system is defined to be where the element or compound comprising one material are the same as the element or compound comprising a second material. A similar material system includes compounds comprised of the same elements but at different ratios. In a similar material system, the materials need not be doped to be the same type. For example, but not to be construed as a limitation, a similar material system may be comprised of a n-type InP substrate and a n-type InP buffer layer. A dissimilar material system is defined to be where the element or compound comprising one material are different from the element or compound comprising a second material. In a dissimilar material system, the materials need not be doped the same type. For example, but not to be construed as a limitation, a dissimilar material system may be comprised of a n-type Si substrate and a n-type CdTe buffer layer. In the present embodiment, for either a similar or dissimilar material system, the buffer layer 117 is doped to be the same type as the substrate 100.

Attached to the substrate 100 or the buffer layer 117 is an absorption layer 115 comprising two or more junctions 125 with cutoff wavelengths in the near infrared, short wave infrared, mid wave infrared, long wave infrared, or far infrared bands. The absorption layer 115 may be comprised of HgCdTe, HgZnTe, InSb, InAs, GaSb, PbTe, GaAs or polymer material systems. The absorption layer 115 is comprised of a first material 120 and a second material 130. The first material 120 may doped either to be either p-type or n-type. The second material 130 may be located adjacent to the first material 120 and doped to be the opposite type, creating a p-n junction.

Another junction 125 may be formed by including a third material 135 in the absorption layer 115. The third material 135 may be located adjacent to the second material 130 and doped such that a p-n junction is created between the second and third materials. Optionally, additional junctions 125 may be formed by incorporating additional materials within the absorption layer 115 and doping the additional materials such that the resulting junctions 125 are p-n junctions.

For example, but not to be construed as a limitation, in a similar material system absorption layer, if the first material 120 is p-type HgCdTe, the second material 130 is then n-type HgCdTe, and the third material 135 is p-type HgCdTe, creating p-n junctions between each layer. In creating additional junctions 125, the fourth material 140 is n-type HgCdTe, resulting in an additional p-n junction.

Optionally, an intrinsic semiconductor material, not shown, may be included between the p-type and n-type materials to create p-i-n junctions. While FIG. 1 illustrates a three junction thermal harvester, any number of junctions may be used.

The junctions 125 within the absorption layer 115 are contemplated to be homo-junctions with each junction 125 comprised of similar material systems. Optionally, each junction may be comprised of different materials from the other junctions. For example, but not to serve as a limitation, a two junction thermal harvester may be comprised of a HgCdTe junction and a InSb junction. The HgCdTe junction is comprised of a p-type HgCdTe material and an n-type HgCdTe material. The InSb junction is comprised of a n-type InSb material and a p-type InSb material.

Optionally hetero-junctions may be used, where the first material 120 and second material 130 composing the junction are comprised of different materials. For example, but not to serve as a limitation, of a hetero-junction configuration of a two junction thermal harvester may be comprised of three materials. The first material 120 may be comprised of p-type HgCdTe, the second material 130 may be comprised of n-type InSb, and the third material 135 may be comprised of p-type PbTe.

Each junction 125 is designed to absorb radiation within a targeted or desired range. Each range is defined by the longest wavelength of photons that can be absorbed, called the cutoff wavelength. The cutoff wavelengths for this embodiment of the invention are located within the near infrared, short wave infrared, mid wave infrared, long wave infrared, and far infrared bands. The cutoff wavelength of the junction may be adjusted by varying the concentration of an element of the semiconductor material comprising the absorption layer 115. For example, but not to serve as a limitation, in a contemplated use of $Hg_{1-x}Cd_xTe$, adjusting the concentration of Cd in the compound determines the bandgap of the material. The bandgap may range from 0 to 1.5 eV, with higher concentrations of Cd resulting in a larger bandgap. Thus, the desired cutoff wavelengths at each junction may be obtained through selecting the appropriate concentration of Cd for the material comprising the junction. Each material in the absorption layer may comprise either different or similar concentrations of Cd. Optionally, the desired cutoff wavelength may also be adjusted by altering the thickness of the semiconductor materials. In the present embodiment, the thickness of the materials is such that electron tunneling will occur.

Any intrinsic material in the absorption layer 115 will be as doped as low as possible, generally a concentration of $10^{15}/cm^3$ or less. The p-type and n-type materials will contain high doping concentrations, typically ranging from $10^{17}/cm^3$ to $10^{18}/cm^3$, but not to the levels of degradation at room temperature.

Attached to the absorption layer 115, on the opposite surface from the substrate 100, is an insulator layer 145. The insulator layer 145 may be comprised of an oxide layer or metal. A first electrode 150 is electrically connected to the material in the absorption layer 115 adjacent to the insulator layer 145. Alternatively, in the case that metal is used for the insulator layer 145, the metal may serve as the first electrode 150.

A second electrode 155 is insulated from all other materials and electrically connected to the first material 120. Alternatively, the second electrode 155 may be electrically connected to either the substrate 100 or buffer layer 117. Alternatively, in the case that metal is used for a substrate 100, the substrate 100 may serve as the electrode 155. The electrodes may be comprised of any suitably conductive material.

Optionally, while the figure illustrates an electrode configuration that passes through the insulator layer 145, other electrode arrangements may be used resulting in a circuit comprising the junctions 125 in series between the first and second electrodes. For example, but not to serve as a limitation, in one configuration both electrodes may be configured to enter the device through the substrate 100; in another configuration one electrode enters from the insulator layer and the other from the substrate; or in a third configuration the electrodes may be planar layers located on opposite sides of the absorption layer 115.

Optionally, in an alternate embodiment the absorption layer 115 may be comprised of an electrolyte layer, not shown. The electrolyte layer may be comprised of any electrolyte material containing free ions. The electrodes electrically connected to the electrolyte layer comprise an anode and a cathode. The anode, the cathode, or both may serve as a photo-electrode. In one embodiment of the electrolyte layer, the cathode may be comprised of metal and the anode may be a photo-anode comprised of an n-type semiconductor. Optionally, if the buffer layer 117 or substrate 100 is n-type, it may serve as a photo-anode. In an alternate embodiment, the anode may be a photo-anode comprised of a n-type semiconductor and the cathode may be a photo-cathode comprised of a p-type semiconductor. Optionally, if the buffer layer 117 or substrate 100 is n-type, it may serve as a photo-anode. Alternatively, if the buffer layer 117 or substrate 100 is p-type, it may serve as a photo-cathode.

In another alternate embodiment the anode may be comprised of metal and the cathode may be a photo-cathode comprised of a p-type semiconductor. Optionally, if the buffer layer 117 or substrate 100 is p-type, it may serve as a photo-cathode. In all the electrolyte layer embodiments, the electrolyte and the photo-electrodes absorb the incoming radiation and generate electricity.

Optionally, in an alternate embodiment, the absorption layer 115 may be comprised of a dye-sensitized layer comprising nanoparticles coated in radiation-sensitive dye and an electrolyte material. The nanoparticles may be comprised of various metals or metal oxides. For example, but not to serve as a limitation, the materials comprising the nanoparticles may be $TiO_2$, ZnO, etc. The dye-sensitized layer may serve as the anode and a separate electrode may serve as a cathode. The cathode may be comprised of any metal, e.g. platinum, cobalt sulfide, etc. Optionally, the absorption layer may be comprised of a hybridized material system, resulting from a combination of dye, electrolyte, and/or semiconductor materials.

The device is oriented to absorb thermal radiation 160 arriving from the indicated direction, first passing through the substrate 100. In a separate embodiment, not shown, if the thermal radiation 160 is arriving from the direction of the insulator layer 145, the insulator layer 145 may be comprised of a material that is transparent to the thermal radiation 150. If metal is being used as an insulator layer 135, the metal may be transparent or partially transparent to the thermal radiation 160 and conductive. For example, but not to serve as a limitation, the metal may be comprised of indium tin oxide (ITO) or $SnO_2$. Optionally, an antireflective coating may be applied on the surface of the insulator layer facing the incoming thermal radiation 160. The anti-reflective coating 110 may be comprised of a single or multiple layers of anti-reflective material and may be planar or non-planar. Optionally, the anti-reflective coating 110 may be comprised of nanocrystals, photonic crystals, or a mixture of both to control the direction of light propagation. The anti-reflective coating may be comprised of $SiO_2$, $SiN_x$, ZnO, metal oxides, insulators, or semiconductors.

Figure 2:
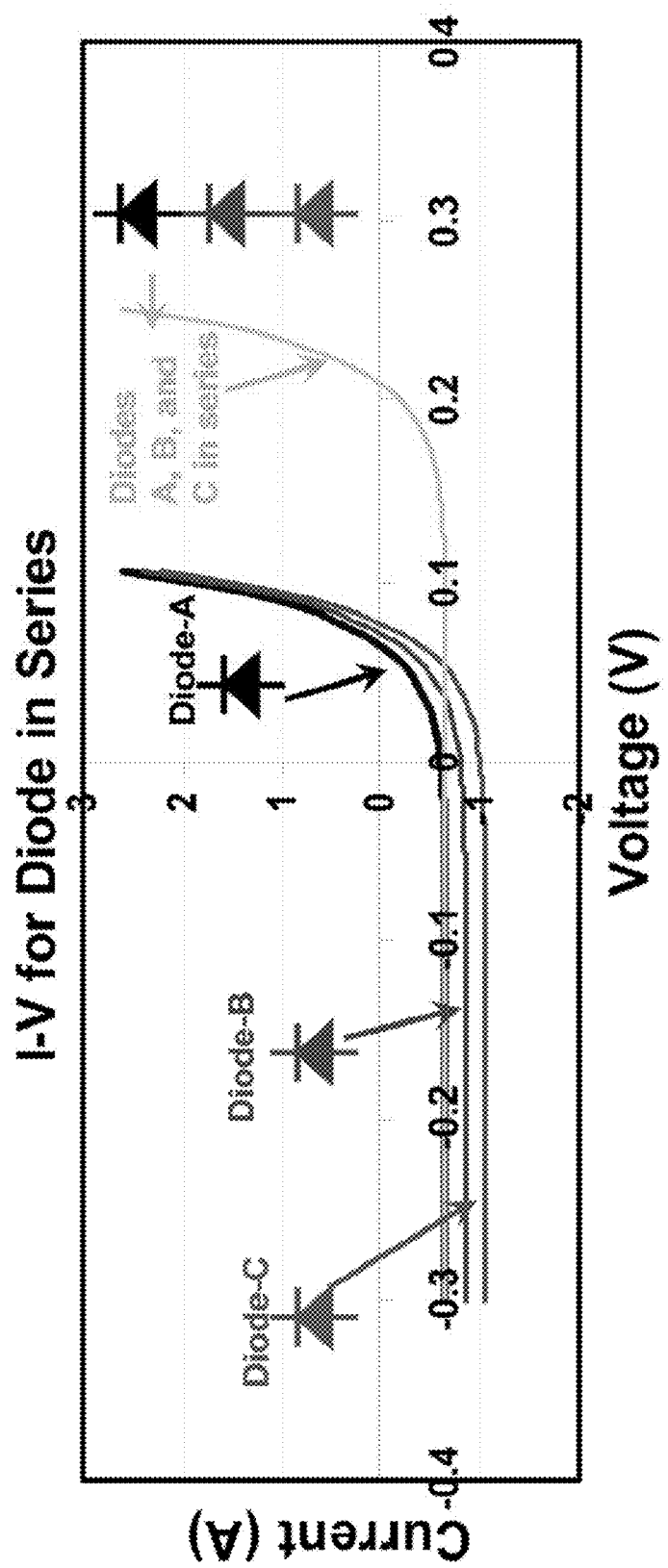
FIG. 2 depicts a current-voltage characteristic chart for multiple harvester junctions in series.

FIG. 2 depicts the current-voltage characteristic of junctions in a multiple junction energy harvester, both individually and connected in series. Each individual junction may be represented as a diode with its own current-voltage (I-V) characteristic. The diodes A, B, and C illustrate that each junction generates a current with a different magnitude. Multiple junctions stacked together may be represented as diodes connected in series. The result is increased open circuit voltage but the magnitude of the current is equal to the lowest magnitude current generated by the diodes, leading to increased power generation. For example, but not to serve as a limitation, when diodes A, B, and C are connected in series, the voltage, $V_d$, is increased from under 0.1 V, for each individual diode, to over 0.2 V. The current of the diodes in series is then equal to the current generated by diode A, the lowest magnitude current. This increased open circuit voltage minimizes the problem excessive dark current or reverse bias leakage current causes in intrinsic carriers at high temperatures because dark current subtracts from harvested energy. With no limitation to low operating temperatures to minimize the dark current, the perpetual energy harvester has the ability to operate in any environment.

Figure 3A:
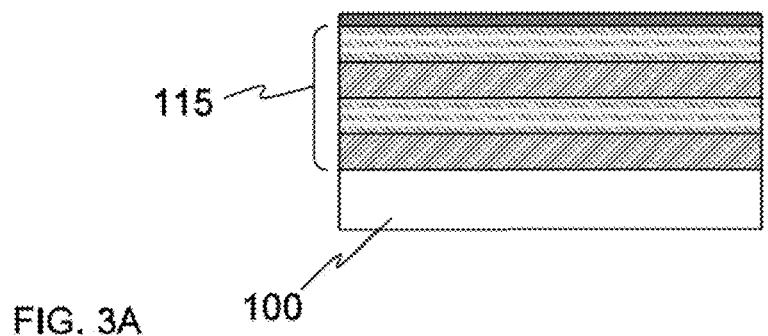
FIGS. 3A-F depicts various compositions of the thermal harvester's absorption layer.

FIG. 3A-F illustrates various embodiments of the absorption layer 115 for the thermal harvester. The electrodes in these embodiments are not shown, but are configured as described in FIG. 1. FIG. 3A illustrates planarized or level materials on top of the substrate 100. The material comprising the absorption layer 115 are created with controlled thickness and density. The materials comprising the absorption layer 115 are as described in FIG. 1. While the figure shows materials of even thickness or width, the width of the material may be altered depending on the desired cutoff wavelength.

Figure 3B:
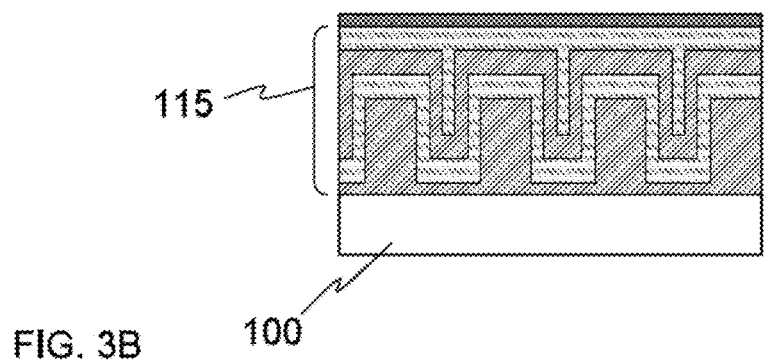

FIG. 3B illustrates an alternative embodiment of the absorption layer 115. The materials comprising the absorption layer 115 are patterned using three-dimensional structures to increase the surface area of the junctions. The thickness and density of the material comprising the junctions are controlled. This may be done through a top down fabrication approach where each layer is planarized and etched prior to the creation of the subsequent layers. Alternatively, the patterns may be formed through a controlled epitaxial growth process. While the figure depicts the three-dimensional structure patterns as rectangular waves, other patterns may be used that increase the surface area while controlling thickness and density of the materials. For example, but not to act as a limitation, sinusoidal waves, triangular waves, arc-shaped waves, columns, cylinders, cones, pyramids, polygonal structures, etc.

Figure 3C:
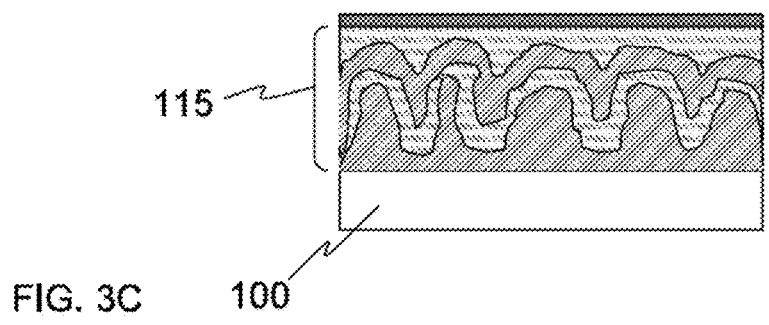

FIG. 3C illustrates another embodiment of a patterned absorption layer 115. The materials comprising the absorption layer 115 are not controlled in their density or thickness and may be created using a bottom-up approach, where each material utilizes a self assembled monolayer. Alternatively, other self-assembly techniques may be used. While the figure depicts a three-dimensional structure wave pattern, other three-dimensional structure patterns may be used which increase the surface area. For example, but not to act as a limitation, sinusoidal waves, triangular waves, rectangular waves, arc-shaped waves, columns, cylinders, cones, pyramids, polygonal structures, etc.

Figure 3D:
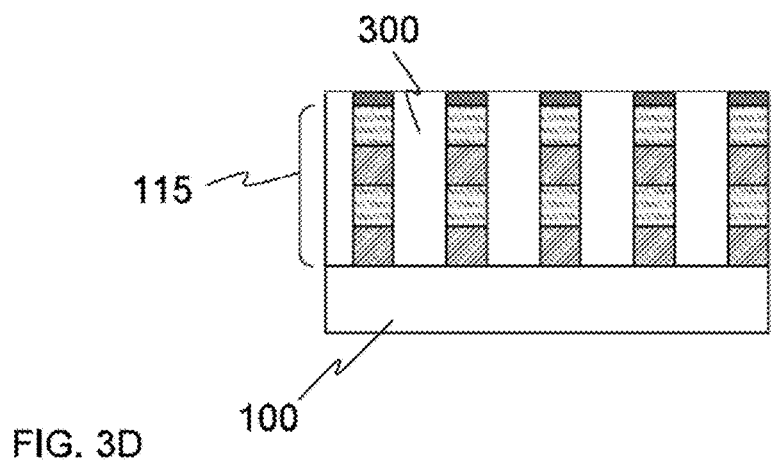

FIG. 3D illustrates another embodiment of the absorption layer 115 with trap structures 300. The trap structures 300 may include any type of formation which traps radiation by reflecting, refracting, or scattering photons within the formation until the photons are absorbed by a junction. The formations may be comprised of gaps, as illustrated in FIG. 3D, or patterned junctions, as illustrated in FIGS. 3B and C. While the trap structures 300 depicted in the embodiment are gaps in the form of columns, other shapes or configurations may be used which trap radiation by reflecting, refracting, or scattering photons. The materials comprising the trap structures 300 may be air, which results in gaps in the insulator layer between the formations.

Figure 3E:
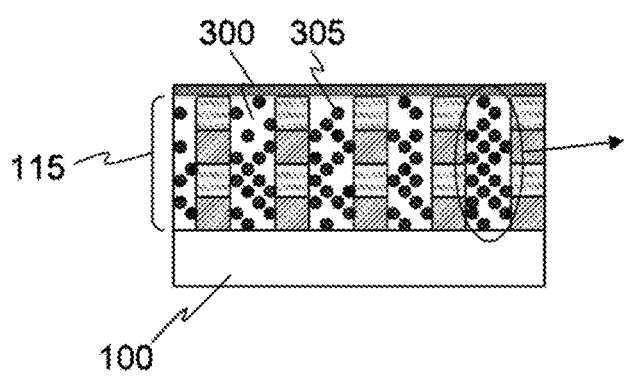
Figure 3F:
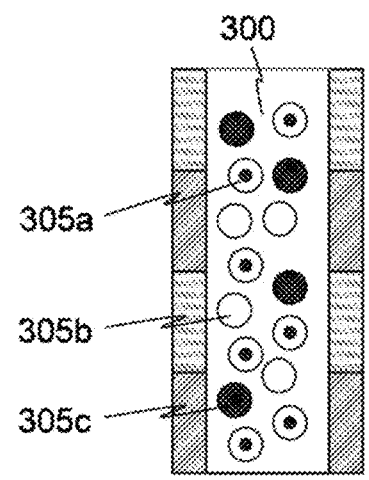

FIG. 3E illustrates an alternate embodiment where the trap structures 300 may be comprised of nanocrystals or nanostructures 305, materials transparent to the wavelengths of radiation to be trapped, and/or materials comprising insulating properties. The nanocrystals or nanostructures 305 may be comprised of nanoparticles, nanowires, nanodots, nanorods, nanotubes, branched nanostructures, nanobipods, nanotripods, nanotetrapods, quantum dots, nanopillars, H shaped structures, cavity structures, crescent structures, chiral or asymmetric structures, or other structural configurations or any combination of the aforementioned. The materials comprising the nanocrystals or nanostructures 305 may include semiconductors, metals, dielectrics, ferroelectrics, insulators, or a combination of materials. Optionally, the nanocrystals or nanostructures 305 may be the same size or varying sizes. The nanocrystals or nanostructures 305 may till the trap structure and/or be embedded into a polymer or insulating material. The material in which the nanocrystals or nanostructures 305 are embedded is transparent to the wavelengths of radiation to be trapped. The nanocrystals or nanostructures 305 assist in enhancing the scattering of photons within the trap structure 300.

The materials comprising insulating properties may include compounds, nanocrystals, embedded nanostructures, or any nanostructure having insulating properties. For example, but not to serve as a limitation, compounds comprising insulating properties may include $SiO_2$, AlN, $AlO_3$, or $SiN_x$. FIG. 4F illustrates an embodiment of nanocrystals, embedded nanostructors, or nanostructures having insulating properties. The nanocrystals may be comprised solely of an insulator material 305a. Alternatively, the nanostructure may be comprised of a core-shell configuration. The core may be comprised of a metal, semiconductor, dielectric, insulator, or ferroelectric material. The shell surrounding the core may be an insulator coating 305b. Alternatively, the trap structure may be filled with insulating material and the nanostructure may be comprised of metal embedded into the insulating material 305c. In addition to aiding the reflection, refracting, or scattering of the trap structure, utilizing material with insulating properties also prevents potential short circuits.

The trapping, reflecting, refracting, or scattering of the radiation within the trap structures 300 until the radiation is absorbed by a junction increases the efficiency of the thermal harvester. In addition, the trap structures 300 slightly increase the cutoff wavelength for each junction, allowing each junction to absorb a slightly wider range of radiation. Moreover, while the figure illustrates an absorption layer 115 comprised of planar materials, trap structures may also be made in absorption layers 115 not comprised of planar materials.

Figure 4A:
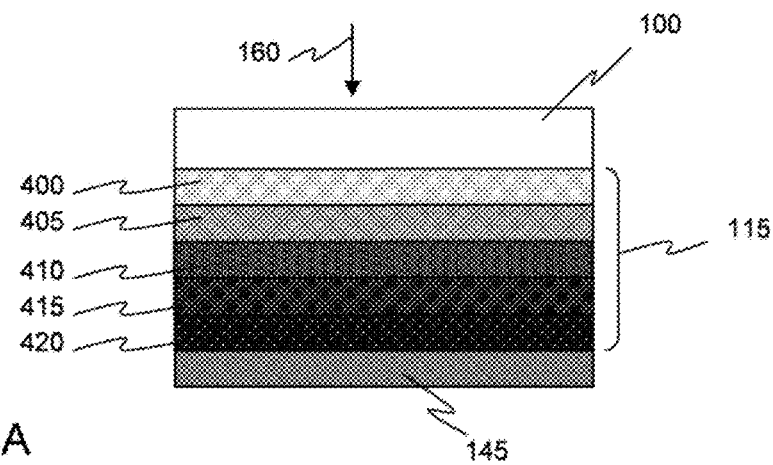
FIGS. 4A-C depicts various cutoff wavelength configurations for the thermal harvester's junctions.
Figure 4B:
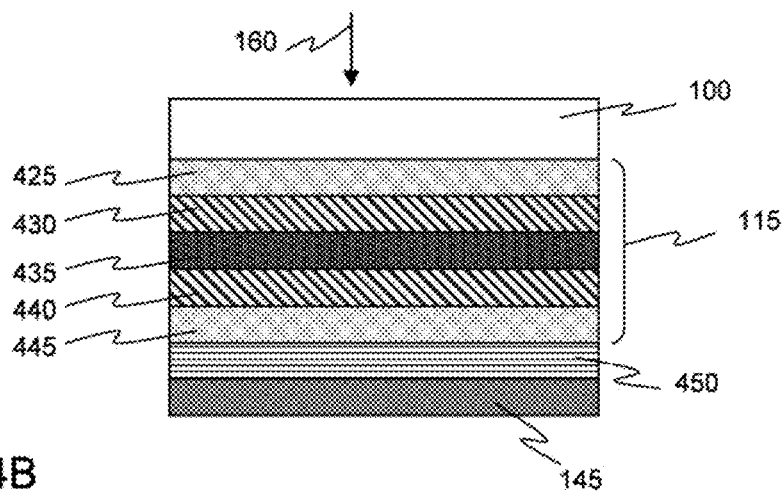
Figure 4C:
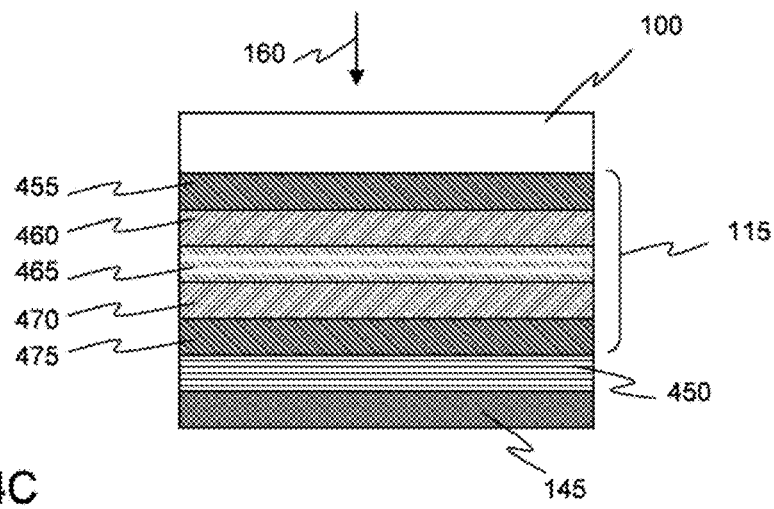

FIG. 4A-C depicts alternative embodiments for configuring the junctions 125 in a multi-layered harvester's absorption layer 115, which are described above in FIG. 1. The electrodes in these embodiments are not shown, but are configured as described in FIG. 1. For clarity of explanation, the shaded layers in this figure represent junctions 125, not materials. While each figure depicts five junctions, any number of junctions play be used.

FIG. 4A illustrates an embodiment of the absorption layer 115 where the junctions 125 are arranged in ascending order of cutoff wavelengths in relation to the direction of the incoming radiation 160. In the depicted embodiment, radiation 160 approaches the device from the direction of the substrate 100. The junction with the shortest cutoff wavelength 400 is located closest to the substrate 100. The junction with the second shortest cutoff wavelength 405 is adjacent to the junction with the shortest cutoff wavelength 400. The sequence continues until the junction with the longest cutoff wavelength 420 is located furthest from the substrate 100 and adjacent to the insulator layer 145.

For example, but not to serve as a limitation, each layer may be designed to absorb radiation in different bands. The shortest cutoff wavelength junction 400 may be designed to absorb radiation in the near infrared band. The next junction 405 may be designed to absorb radiation in the short-wave infrared band. The following junction 410 may be designed to absorb radiation in the mid-wave infrared band. The subsequent junction 415 may be designed to absorb radiation in the long-wave infrared band. The last junction 420 may be designed to absorb radiation in the far infrared band.

In an alternate embodiment where the radiation 160 approaches the device from the insulator layer 145, not shown, the junction with shortest cutoff wavelength 400 is located adjacent to the insulator layer 145. The subsequent junctions are arranged in order of ascending cutoff wavelengths with the junction with the longest cutoff wavelength 420 adjacent to the substrate 100.

FIG. 4B illustrates an embodiment of the absorption layer 115 with junctions 125 in a long central wavelength configuration, where the longest cutoff wavelength junction 435 is located between junctions that have shorter cutoff wavelengths. In the depicted embodiment, the junction with the longest cutoff wavelength 435 is in the center and is surrounded by the junctions with the next longest cutoff wavelengths 430 and 440. The junctions with the shortest cutoff wavelengths 425 and 445 are located furthest away from the center layer 435. The junctions not located in the center may have the same or different cutoff wavelengths. Alternatively, the junctions may be arranged in ascending cutoff wavelengths until reaching the longest cutoff wavelength junction 435 and begin ascending again starting with the junctions with the shortest cutoff wavelength.

The reflective layer 450 is comprised of a material which reflects the radiation back through the absorption layer 115. Examples of this material may include various types of metals or metamaterials, including electromagnetic bandgap metamaterials such as photonic crystals or left handed materials which control the direction of light propagation. This configuration increases efficiency by allowing energy to be absorbed from radiation coming from multiple directions. For example, but not to serve as a limitation, the radiation to be harvested may arrive by passing through the insulator layer 145, be reflected after passing unabsorbed through the junctions 125, or pass through the substrate 100.

FIG. 4C illustrates an embodiment for the absorption layer 115 in a short central wavelength configuration, where the longest cutoff wavelength junctions 455 and 475 are located adjacent to the substrate 100 and reflective layer 450, with the shorter cutoff wavelength junctions 460, 465, and 470 located in between. In the present depiction, the junction with the shortest cutoff wavelength 465 is located in the center. Optionally, this embodiment may apply to any configuration where a junction with a shorter cutoff wavelength is between junctions with longer cutoff wavelengths. This configuration has similar capabilities as the configuration described in FIG. 4B.

FIG. 5A-I illustrates a process for creating both single and multiple layered thermal harvesters. The electrodes in this process are not shown, but are configured as described in FIG. 1. FIG. 5A illustrates the beginning of the process with a substrate 500. The substrate 500 may be comprised of group IV semiconductors, group III-V semiconductors, group II-VI semiconductors, SOI, dielectric, insulator, polymer, or metal. The group IV semiconductors may include, but are not limited to, Si, polysilicon, SiC, Ge, or Si—Ge alloy. Group compounds may be comprised of AlN, GaAs, GaN, InP, GaSb, or InSb. Group II-VI compounds may be comprised of CdZnTe, HgCdTe, mercury HgZnTe, ZnO, ZnS, CdS, or CdTe. The substrate 500 is subject to an oxidization process as shown in FIG. 5B. The process creates an oxidized layer 505 on both the top and bottom surfaces of the substrate.

Optionally, FIG. 5C one surface of the substrate is patterned and etched using a lithographic process, creating grooves 510 or a pattern that acts as an anti-reflective surface to direct the radiation. Alternatively, instead of etching the pattern into the substrate 500, the pattern may be created by attaching a layer of material comprising the pattern to the substrate 500. The addition of a layer comprising a pattern may be done through wafer bonding, growth, or deposition techniques. FIG. 5D shows the removal of the remaining oxide material prior to proceeding with additional steps. FIG. 5E illustrates an optional step of depositing an antireflective coating 515 on the same side as the grooves 510 to function as an antireflective surface. The antireflective coating 515 may be comprised of multiple layers or a nanocrystal layer. Alternatively, an oxide layer may be used instead of the antireflective coating 515.

FIG. 5F depicts the removal of the oxide layer 505 from the non-etched surface. Optionally after the removal of the oxide layer 505, a buffer layer 520 may be added. The buffer layer 520 may be comprised of group IV semiconductors, group III-V semiconductors, or group II-VI semiconductors. Group IV semiconductors are not limited to but may include Si, polysilicon, SiC, Ge, or SiGe alloy. Group III-V semiconductors are not limited to but may include AlN, GaAs, GaN, InP, GaSb, or InSb. Group II-VI semiconductors are not limited to but may include CdZnTe, HgCdTe, HgZnTe, ZnO, ZnS, CdS, or CdTe. Optionally, the buffer layer 520 may be a similar material system or a dissimilar material system from the substrate 500. In either material system, the butler layer is doped to be the same type as the substrate 500.

The buffer layer 520 may be epitaxially grown, deposited, or wafer bonded to the substrate 500. A absorption layer 525, comprising at least one junction, is created either directly on the substrate 500 or the buffer layer 525. The absorption layer 525 may be comprised of p-n or p-i-n junctions. The absorption layer 525 may be created by growing a semiconductor material 530, which may be doped either p-type or n-type. A second semiconductor material 540 may be grown on and doped to be the opposing type from the first semiconductor material 530 to create a p-n junction. Optionally, an intrinsic material 535 may be included between the p-type and n-type semiconductor materials to create a p-i-n junction. The growth of the materials may be accomplished through various techniques such as Molecular Beam Epitaxy (MBE), vapor phase epitaxy (VPE), liquid-phase epitaxy (LPE), metal-organic chemical vapor deposition (MO-CVD), or other chemical vapor deposition techniques. Alternatively, a p-type or n-type semiconductor material 530 may be grown and the upper portion may be doped to the opposite type creating the second semiconductor material 540.

Optionally, to create multiple junctions, additional semiconductor materials may be added. FIG. 5F illustrates a third semiconductor material 545, doped to be the opposite type of 540. Optionally, an intrinsic material 535 may be included between the second and third semiconductor materials to create a p-i-n junction. The semiconductor materials 530, 540, 545 and intrinsic material 535 may be comprised of HgCdTe, HgZnTe, InSb, InAs, GaSb, GaAs, or PbTe material systems. Optionally, each individual junction may be comprised of a different material.

The junctions within the absorption layer 525 are contemplated to be homo-junctions comprised of a single material. Optionally, hetero-junctions may be used. For example, but not to serve as a limitation, in a two junction thermal harvester comprised of three materials, the first material may be comprised of HgCdTe and doped to be p-type, the second material may be comprised of InSb and doped n-type, and the third material may be comprised of PbTe and doped p-type. While FIG. 5F depicts a absorption layer 525 with two junctions, any number of junctions may be created using this process. The absorption layer 525 may be arranged in a variety of configurations as illustrated in FIGS. 3 and 4.

FIG. 5G illustrates an optional step to create trap structures 550 within the absorption layer 525 through an etching process, such as photolithography, to create the desired shape and configuration of the trap structures. While the trap structures 550 depicted in the process are columns, other shapes or configurations may be used which reflect the radiation until it is absorbed by a junction.

The etched trap structures 550 may be filled with a material that is transparent to the wavelength of radiation desired to be trapped 555, as shown in FIG. 5H. Filling the trap structures with transparent material and the nanostructures may be accomplished through spin coating, MBE, VPE, LPE, MO-CVD, other chemical vapor deposition, or printing or ink-jettable techniques. The material 555 is then planatized to be level with absorption layer 525. FIG. 5I shows the addition of an insulator layer 560 over the absorption layer 525. Alternatively, air may be used for the etched trap structures, not shown, resulting in gaps in the insulator layer 560 between the columns.

The embodiments were chosen and described in order to explain the principles and applications of the invention, thereby allowing others skilled in the art to utilize the invention in its various embodiments and modifications according to the particular purpose contemplated. The scope of the invention is intended to be defined by the claims appended hereto and their equivalents.

What is claimed:

1. A thermal energy harvester, comprising:
a substrate;
a buffer layer;
a first electrode;
a second electrode;
an absorption layer electrically connected between the first and second electrodes comprising,
a first material;
a second material of a different type that the first material; and
a third material of a different type than the second material;
wherein at least one of the first material, the second material, and the third materials are selected from the group consisting of InSb, InAs, GaSb, and PbTe, or a combination thereof, wherein when GaSb is selected, at least one of the first material, the second material, or the third material is selected from the group consisting of InSb, GaAs, InP, GaN, AlN, InAs, and PbTe, or a combination thereof, wherein the first, the second, and the third materials are in a p-n or pin junction with each other in the absorption layer comprises two or more p-n or p-i-n junctions comprising three-dimensional-structures, wherein the two or more p-n or pin junctions are in series increasing the open circuit voltage, and wherein the two or more p-n or p-i-n junctions comprising cutoff wavelength between 2 µm to 40 µm.

2. The thermal energy harvester in claim 1, wherein the buffer layer comprises of a group consisting of Si, polysilicon, SiC, Ge, SiGe, AlN, GaAs, GaN, InP, GaSb, InSb, CdZnTe, HgCdTe, ZnO, ZnS, CdS, and CdTe, wherein the buffer layer and the substrate are dissimilar materials.

3. The thermal energy harvester in claim 1, further comprising:
a trap structure within the absorption layer, wherein the trap structure comprises a formation which reflects, refracts, and/or scatters photons within the formation until the photons are absorbed by the two or more p-n or p-i-n junctions and wherein the buffer layer is planer.

4. The thermal energy harvester in claim 1, further comprising:
an antireflective coating on a surface facing incoming radiation, and an insulating layer, wherein the surface is selected from a group consisting of the substrate and the insulator layer, wherein the antireflective coating, comprises at least one planar layer and/or nanoscaled layer of material, wherein the antireflective coating directs thermal radiation through the absorption layer.

5. The thermal energy harvester in claim 1, further comprising:
at least one planar p-n or p-i-n junction within the absorption layer arranged in a configuration of ascending cutoff wavelength beginning from the direction of incoming radiation.

6. The thermal energy harvester in claim 1, further comprising:
a reflective layer between the absorption layer and an insulator layer, wherein the two or more p-n or p-i-n junctions within the absorption layer are selected from a group consisting of a junction with the shortest cutoff wavelength located between junctions with longer cutoff wavelengths and a junction with the longest cutoff wavelength located between junctions with shorter cutoff wavelengths, and wherein the insulating layer is planar.

7. A thermal energy harvester, comprising:
a substrate;
a buffer layer, wherein the buffer layer is planar;
a first electrode;
a second electrode;
an absorption layer electrically connected between the first and second electrodes comprising,
a first material;
a second material of a different type that the first material; and
a third material of a different type than the second material;
wherein at least one of the first material, the second material, and the third material are selected from a group consisting of InSb, InAs, GaSb, and PbTe, or a combination thereof material systems, wherein when GaSb is selected, at least one of the first material, the second material, or the third material is selected from the group consisting of InSb, GaAs, InP, GaN, AlN, InAs, and PbTe, or a combination thereof, wherein the first material, the second material, and the third material are in a p-n or pin junction with each other in the absorption layer comprises two or more p-n or p-i-n junctions comprising three-dimensional structures, wherein the two or more p-n or pin junctions are in series increasing the open circuit voltage, and wherein the two or more p-n or p-i-n junctions comprising cutoff wavelength between 2 µm to 40 µm, and wherein the three dimensional structures are selected from a group consisting of waves, cylinders, cones, pyramids, and polygonal structures.

8. The thermal energy harvester in claim 7, further comprising:
an antireflective coating on a surface facing incoming radiation, and an insulating layer, wherein the surface is selected from a group consisting of the substrate and the insulator layer, wherein the antireflective coating comprises at least one planar layer and/or nanoscaled layer of material, wherein the antireflective coating directs, thermal radiation through the absorption layer.

9. The thermal energy harvester in claim 7, wherein the absorption layer further comprises an electrolyte layer, wherein the electrolyte layer comprised, an electrolyte material containing free ions, and wherein the electrolyte layer electrically connects to the first electrode and the second electrode.

10. The thermal energy harvester in claim 7 further comprising a trap structures within the absorption layer, wherein the trap structure comprises of nanocrystals or nanostructures which reflects, refracts, and/or scatters photons until the photons are absorbed by the two or more p-n or p-i-n junctions.

11. The thermal energy harvester in claim 7, further comprising:
at least one planar p-n or p-i-n junction within the absorption layer arranged in a configuration of ascending cutoff wavelength beginning from the direction of incoming radiation.

12. The thermal energy harvester in claim 7 wherein the two or more p-n or p-i-n junctions within the absorption layer arranged in a configuration of ascending cutoff wavelength from the direction of incoming radiation.

13. The thermal energy harvester in claim 7, further comprising:
a reflective layer between the absorption layer and an insulator layer, wherein the two or more p-n or p-i-n junctions within the absorption layer is arranged in a configuration selected from a group consisting of a junction with the shortest cutoff wavelength located between junctions with longer cutoff wavelengths and a junction with the longest cutoff wavelength located between junctions with shorter cutoff wavelengths.

14. A thermal energy harvester, comprising:
a substrate;
a buffer layer, wherein the buffer layer is planar;
a first electrode;
a second electrode;
an absorption layer electrically connected between the first and second electrodes comprising,
a first material;
a second material of a different type that the first material;
a third material of a different type than the second material; wherein at least one of the first material, the second material, and the third material are selected from a group consisting of InSb, InAs, GaSb, and PbTe, or a combination thereof material systems, wherein when GaSb is selected, at least one of the first material, the second material, or the third material is selected from the group consisting of InSb, GaAs, InP, GaN, AlN, InAs, and PbTe, or a combination thereof, wherein the first, the second, and the third materials are in a p-n or pin junction with each other in the absorption layer comprises two or more p-n or p-i-n junctions comprising three-dimensional structures, wherein the two or more p-n or pin junctions are in series increasing the open circuit voltage, and wherein the two or more p-n or p-i-n junctions comprising cutoff wavelength between 2 Ξm to 40 μm, and wherein the three dimensional structures are selected from a group consisting of waves cylinders, cones, pyramids, and polygonal structured; and
an antireflective coating on, a surface facing incoming radiation, wherein the antireflective coating comprises at least one planer and/or nanoscaled layer of material, wherein the antireflective coating directs the radiation through the absorption layer.

15. The thermal energy harvester in claim 14 further comprising a trap structures within the absorption layer, wherein the trap structure comprises of nanocrystals or nanostructures which reflects, refracts, and/or scatters photons until the photons are absorbed by the two or more p-n or p-i-n junctions.

16. The thermal energy harvester in claim 14 further comprising:
a reflective layer between the absorption layer and an insulator layer, wherein the two or more p-n or p-i-n junctions within the absorption layer is arranged in a configuration selected from a group consisting of a junction with the shortest cutoff wavelength located between junctions with longer cutoff wavelengths and a junction with the longest cutoff wavelength located between junctions with shorter cutoff wavelengths.

17. The thermal energy harvester in claim 14, further comprising:
at least one planar p-n or p-i-n junction within the absorption layer arranged in a configuration of ascending cutoff wavelength beginning from the direction of incoming radiation.

18. The thermal energy harvester in claim 14, wherein the two or more p-n or p-i-n junctions within the absorption layer arranged in a configuration of ascending cutoff wavelength from the direction of incoming radiation.

19. The thermal energy harvester in claim 14, the absorption layer further comprises an electrolyte layer, wherein the electrolyte layer comprised an electrolyte material containing free ions, and wherein the electrolyte layer electrically connects to the electrodes.

* * * * *